(12) United States Patent
Kugimoto et al.

(10) Patent No.: US 11,848,223 B2
(45) Date of Patent: Dec. 19, 2023

(54) ELECTROSTATIC CHUCK DEVICE AND METHOD FOR PRODUCING ELECTROSTATIC CHUCK DEVICE

(71) Applicant: SUMITOMO OSAKA CEMENT CO., LTD., Tokyo (JP)

(72) Inventors: Hironori Kugimoto, Tokyo (JP); Masaki Ozaki, Tokyo (JP); Takeshi Watanabe, Tokyo (JP); Kentaro Takahashi, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 738 days.

(21) Appl. No.: 16/970,615

(22) PCT Filed: Feb. 19, 2019

(86) PCT No.: PCT/JP2019/006059
§ 371 (c)(1),
(2) Date: Aug. 17, 2020

(87) PCT Pub. No.: WO2019/163757
PCT Pub. Date: Aug. 29, 2019

(65) Prior Publication Data
US 2021/0074570 A1    Mar. 11, 2021

(30) Foreign Application Priority Data

Feb. 20, 2018 (JP) ................. 2018-027750

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32642* (2013.01); *H01J 37/32715* (2013.01);
(Continued)

(58) Field of Classification Search
CPC ......... H01L 21/67109; H01L 21/67069; H01L 21/6833; H01L 21/68735; H01L 21/68757;
(Continued)

(56) References Cited

U.S. PATENT DOCUMENTS

2010/0326957 A1* 12/2010 Maeda ................... H01J 37/20
156/345.26

FOREIGN PATENT DOCUMENTS

JP      07-297265 A     11/1995
JP      07297265 A  *  11/1995
(Continued)

OTHER PUBLICATIONS

Machine translation of Arai et al. Japanese Patent Document JP H07-297265 A Nov. 10, 1995 (Year: 1995).*
(Continued)

*Primary Examiner* — Kevin J Comber
(74) *Attorney, Agent, or Firm* — Merchant & Gould P.C.

(57) ABSTRACT

An electrostatic chuck device includes: a mounting table provided with amounting surface on which a plate-shaped sample is mounted; an annular focus ring; and a cooling element for cooling the focus ring, in which the mounting table has a holding portion provided to surround the mounting surface, and the holding portion includes an annular groove surrounding the mounting surface, and a through-hole that is open on a bottom surface of the groove, wherein a tubular insulator has been inserted into the through-hole, the holding portion has upper surfaces, which are located on both sides of the groove in a width direction, as holding surfaces that are in contact with the focus ring and hold the focus ring, wherein the holding surface satisfies the following conditions (i) to (iii); (i) surface roughness is 0.05 μm or less, (ii) a flatness is 20 μm or less, and (iii) the holding
(Continued)

surface does not have a recess having a depth of 1.0 μm or more and extending in a direction intersecting the holding surface.

20 Claims, 9 Drawing Sheets

(52) U.S. Cl.
CPC .. *H01J 37/32724* (2013.01); *H01L 21/67069* (2013.01); *H01J 2237/002* (2013.01); *H01J 2237/2007* (2013.01)

(58) Field of Classification Search
CPC ............ H01L 21/3065; H01J 37/32715; H01J 37/32724; H01J 37/32642; H01J 2237/002; H01J 2237/2007; H02N 13/00
USPC ......................................................... 361/234
See application file for complete search history.

(56) References Cited

FOREIGN PATENT DOCUMENTS

| | | |
|---|---|---|
| JP | 2002-033376 A | 1/2002 |
| JP | 2011-009351 A | 1/2011 |
| JP | 2012-134375 A | 7/2012 |

OTHER PUBLICATIONS

International Search Report for PCT/JP2019/006059 (dated Apr. 23, 2019).

\* cited by examiner

ELECTROSTATIC CHUCK DEVICE AND METHOD FOR PRODUCING ELECTROSTATIC CHUCK DEVICE

The application is a U.S. National Stage Application under 35 U.S.C. § 371 of International Patent Application No. PCT/JP2019/006059, filed on Feb. 19, 2019, which claims priority to Japanese Patent Application No. 2018-027750 filed in Japan on Feb. 20, 2018, the disclosures of all of which are hereby incorporated by reference in their entireties.

TECHNICAL FIELD

The present invention relates to an electrostatic chuck device and a method for producing an electrostatic chuck device.

The present application claims priority based on Japanese Patent Application No. 2018-027750 filed in Japan on Feb. 20, 2018, and the content thereof is incorporated herein.

BACKGROUND

In the related art, in a plasma etching apparatus which is used in a semiconductor manufacturing process, an electrostatic chuck device capable of mounting and fixing a wafer (plate-shaped sample) on a sample table and maintaining the wafer at a desired temperature is used. This electrostatic chuck device is provided with a ring member (focus ring) disposed at an outer peripheral portion of a wafer attraction portion to surround a wafer loading surface at an upper portion.

In the plasma etching apparatus of the related art, if the wafer fixed to the electrostatic chuck device is irradiated with plasma, the surface temperature of the wafer rises. Therefore, in order to suppress a rise in the surface temperature of the wafer, a cooling medium is circulated through a temperature adjustment base part of the electrostatic chuck device to cool the wafer from the lower side.

Further, if the wafer is irradiated with plasma, the surface temperature of the focus ring rises similar to the wafer. In this way, a temperature difference occurs between the temperature adjustment base part and the focus ring, and thus there is a case were in-plane variations in the surface temperature of the wafer occurs. Therefore, there is known a technique for cooling the focus ring in order to suppress a rise in the surface temperature of the focus ring.

For example, Patent Literature No. 1 discloses an electrostatic chuck device provided with second electrostatic attraction means for attracting a focus ring to an outer peripheral portion of a wafer. In the electrostatic chuck device disclosed in Patent Literature No. 1, the focus ring is attracted to an electrostatic chuck portion with a force larger than the force of attracting the wafer, and a cooling medium (cooling gas) is sprayed on the back surface of the focus ring to adjust the temperature of the focus ring.

Further, for example, Patent Literature No. 2 discloses an electrostatic chuck device provided with a gas supply unit that supplies a heat transfer gas to each of a wafer attraction portion attracted by an electrostatic chuck portion and a focus ring. In the electrostatic chuck device disclosed in Patent Literature No. 2, the temperatures of the wafer attraction portion and the focus ring can be independently controlled.

CITATION LIST

Patent Literature

[Patent Literature No. 1] Japanese Laid-open Patent Publication No. 2002-033376
Patent Literature No. 2: Japanese Laid-open Patent Publication No. 2012-134375

SUMMARY OF INVENTION

Technical Problem

In recent years, with an increase in output of plasma etching apparatuses, the thermal energy of plasma applied to a wafer has increased, and the surface temperature of the focus ring has become high. On the other hand, there is a case where a method of cooling a focus ring by increasing the pressure of a cooling gas is adopted. However, in the electrostatic chuck devices of the related art, as disclosed in Patent Literature No. 1 and Patent Literature No. 2, there is a case where the surface temperature of the focus ring cannot be sufficiently controlled. The electrostatic chuck device has been required to be further improved.

The present invention has been made in view of the above circumstances, and provides an electrostatic chuck device and a method for producing the electrostatic chuck device, in which it is possible to make the surface temperature of a plate-shaped sample uniform.

Solution to Problem

As a result of intensive studies conducted by the inventors in order to solve the above problems, as one of the factors that make it impossible to sufficiently control the surface temperature of the focus ring, leakage of a cooling gas was found. It was also found that if the pressure of the cooling gas increases, the leak amount of the cooling gas increases. Therefore, the inventors have found that according to the electrostatic chuck device of the following aspect, the leakage of the cooling gas can be reduced, and have completed the present invention.

According to a first aspect of the present invention, there is provided an electrostatic chuck device including: amounting table provided with a mounting surface on which a plate-shaped sample is mounted; an annular focus ring; and a cooling element for cooling the focus ring, in which the mounting table has a holding portion provided to surround the mounting surface, and the holding portion includes an annular groove surrounding the mounting surface, and a through-hole that is open on a bottom surface of the groove, wherein a tubular insulator has been inserted into the through-hole, the holding portion has upper surfaces, which are located on both sides of the groove in a width direction in the holding portion, as holding surfaces that are in contact with the focus ring and hold the focus ring, wherein the holding surfaces satisfy the following conditions (i) to (iii).

(i) Surface roughness of the holding surfaces is 0.05 µm or less.
(ii) A flatness of the holding surfaces is 20 µm or less.
(iii) The holding surfaces do not have a recess having a depth of 1.0 µm or more and extending in a direction intersecting the holding surfaces.

In the first aspect of the present invention, it is preferable that the holding portion is provided with the groove, the through-hole, and a conduit extending in a thickness direction of the holding portion, wherein a bottom surface of the groove and the conduit overlap each other in a plan, and a tubular insulator is inserted into the conduit.

According to a second aspect of the present invention, there is provided a method for producing the electrostatic chuck device described above, the method including: preparing a temporary mounting table, which has a sintered body provided with a mounting surface on which a plate-shaped sample is mounted and a through-hole provided at circumference of the mounting surface and a tubular insulator which has been inserted into the through-hole, a first grinding step of grinding a surface of the circumference of the mounting surface of the sintered body into an annular shape; a step of forming a groove surrounding the mounting surface by digging down the sintered body; and a second grinding step of grinding again to grind upper surfaces, which are located on both sides of the groove in a width direction.

In the second aspect of the present invention, a grindstone in which a length of the grindstone in a rotation axis direction is longer than a length of the groove in the width direction may be used in the second grinding step.

In the second aspect of the present invention, the through-hole in which the insulator has been inserted may be ground by the first grinding step and the step of forming the groove, and the through-hole in which the insulator is inserted may not be ground in the second grinding step.

In the second aspect of the present invention, the temporary mounting table may further have, at the circumference of the mounting surface, a conduit which extends in a thickness direction, and in which a tubular insulator has been inserted, one end of the conduit may not be exposed on the surface of the sintered body, and grinding which is performed in the first grinding step and the step of forming the groove generates a through-hole that is open on a bottom surface of the groove and is formed from the conduit.

Advantageous Effects of Invention

According to an aspect of the present invention, provided are an electrostatic chuck device and a method for producing the electrostatic chuck device, in which it is possible to make the surface temperature of a plate-shaped sample uniform.

DESCRIPTION OF EMBODIMENTS

Figure 1:
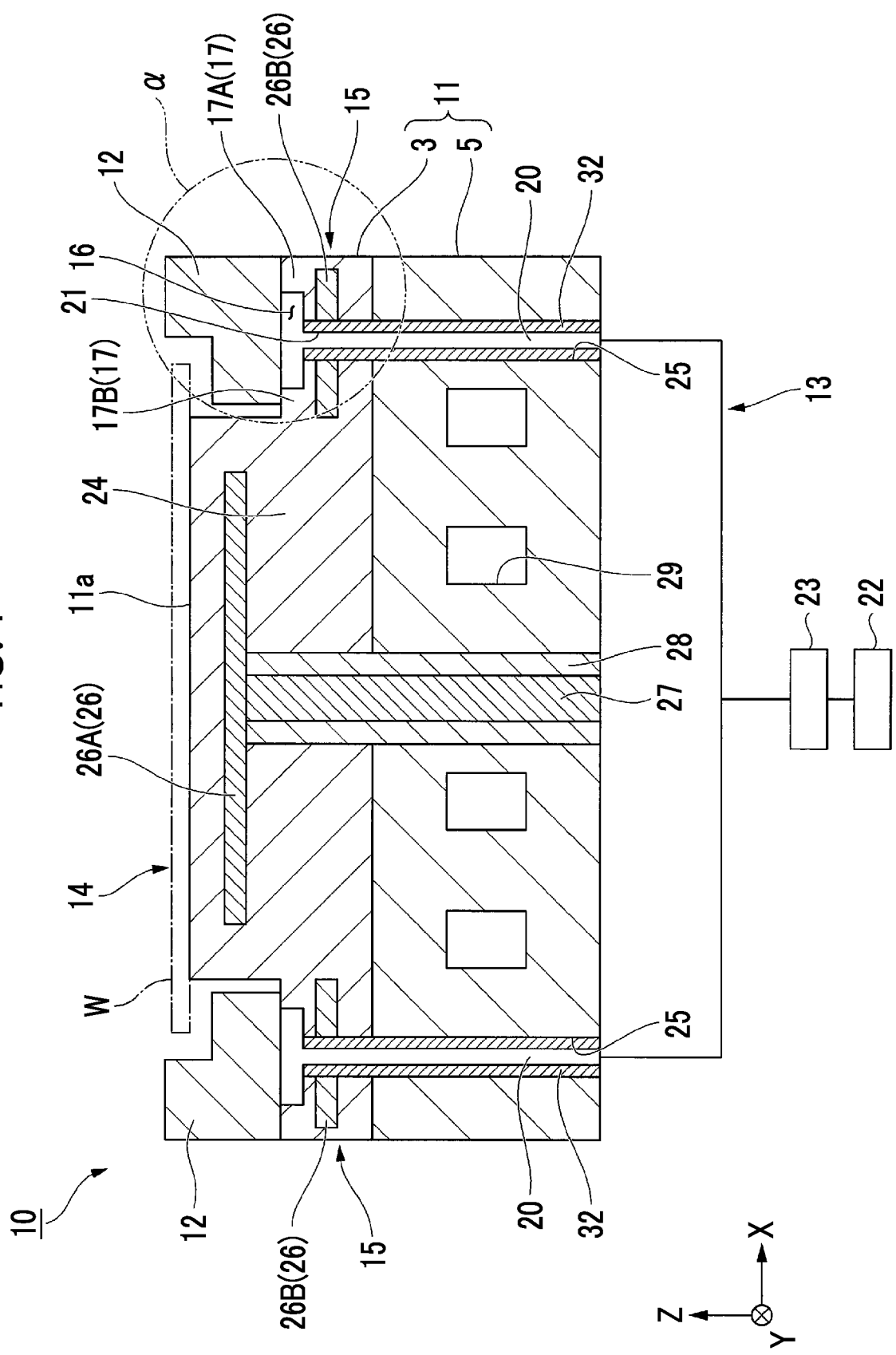
FIG. 1 is a schematic sectional view on an XZ plane, showing an electrostatic chuck device of the present embodiment.

Hereinafter, embodiments of an electrostatic chuck device and a method for producing the electrostatic chuck device according to the present invention will be described with reference to the drawings.

The following description is a specific description for better understanding of the gist of the invention, and does not limit the invention unless otherwise specified. The number, position, size, numerical value, or the like can be changed, omitted, or added within a scope which does not depart from the invention. Further, in the drawings which are used in the following description, for the purpose of emphasizing characteristic portions, there is a case where the characteristic portions are shown in an enlarged manner for convenience, and the dimensions ratio, or the like of each constituent element may be the same as or different from the actual dimensions or ratio. Further, for the same purpose, there is a case where non-characteristic portions are omitted in the drawings.

<Electrostatic Chuck Device>

Figure 2:
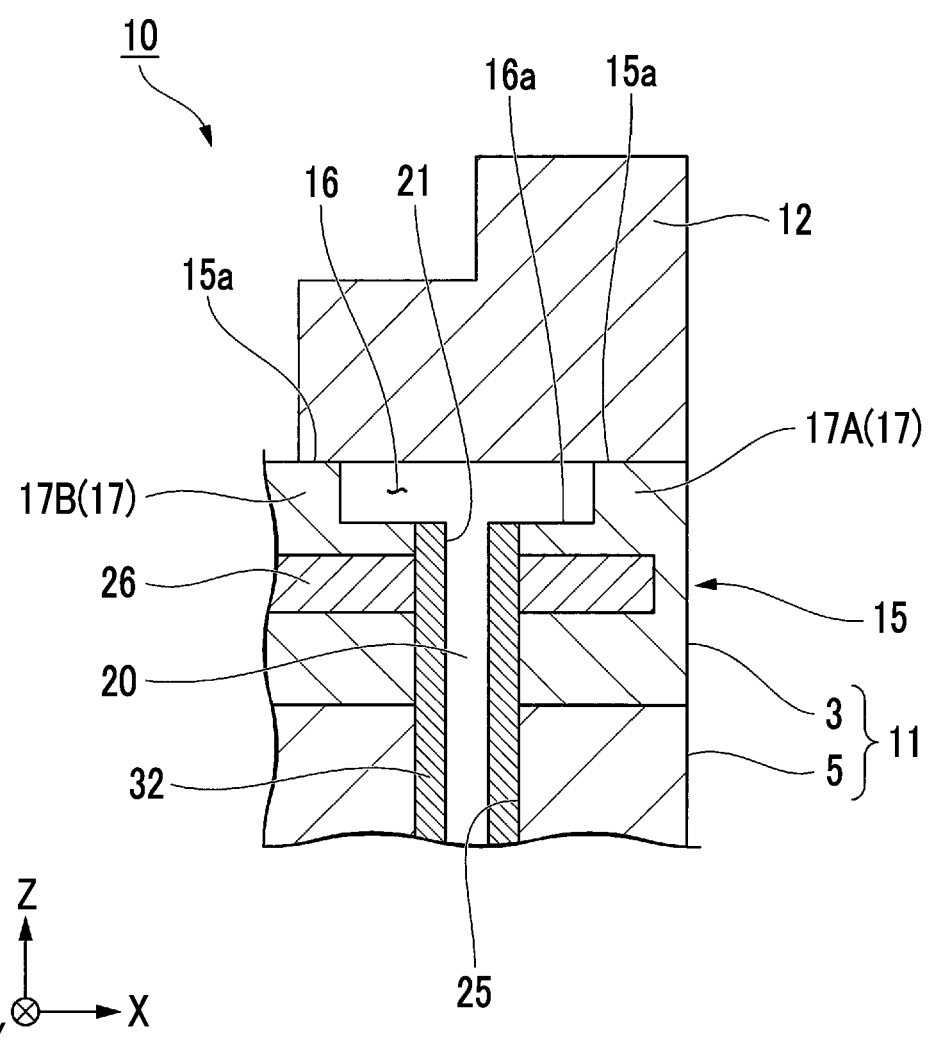
FIG. 2 is a schematic partial enlarged view in which an area indicated by a in FIG. 1 is enlarged.

FIG. 1 is a schematic sectional view on an XZ plane, showing an electrostatic chuck device of the present embodiment. FIG. 2 is a schematic partial enlarged view in which an area indicated by a in FIG. 1 is enlarged.

An electrostatic chuck device 10 shown in FIG. 1 includes a mounting table 11, a focus ring 12, and a cooling element 13.

In the following description, an XYZ coordinate system is set, and the positional relationship of each member will be described with reference to the XYZ coordinate system. At this time, the thickness direction of the mounting table 11 is defined as a Z-axis direction, one direction orthogonal to the Z-axis direction is defined as an X-axis direction (right-left direction in FIG. 1), and the direction orthogonal to the Z-axis direction and the X-axis direction is defined as a Y-axis direction. In this embodiment, the Z-axis direction is a vertical direction.

[Mounting Table]

The mounting table 11 shown in FIG. 1 is provided with a mounting surface 11a on which a plate-shaped sample W such as a semiconductor wafer is mounted. The mounting table 11 includes an attraction member 3 and a cooling base 5.

[Attraction Member]

The attraction member 3 includes a dielectric substrate 24 and an electrode layer 26.

The dielectric substrate 24 shown in FIG. 1 has a protrusion shape as a whole, that is, forms a hill portion, and mounting surface 11a is made relatively high.

Although the material for forming the dielectric substrate 24 can be optionally selected, it is preferable to use ceramics having heat resistance. As such ceramics, a sintered body of aluminum nitride (AlN), aluminum oxide (alumina, $Al_2O_3$), silicon nitride ($Si_3N_4$), zirconium oxide ($ZrO_2$), yttrium oxide ($Y_2O_3$), sialon, boron nitride (BN), or silicon carbide (SiC) can be given as an example. It may be a composite sintered body using two or more types of the materials described above.

Above all, the material for forming the dielectric substrate 24 is preferably a compound material of silicon carbide and aluminum oxide. In this way, the dielectric constant of the dielectric substrate 24 can be increased, and the electrostatic attraction of the plate-shaped sample W tends to become good. Further, the risk of impurities with respect to the plate-shaped sample W can be suppressed to a low level.

As the material for forming the dielectric substrate 24, one type may be used alone, or two or more types may be used in combination.

The average crystal grain size of the material for forming the dielectric substrate 24 is not particularly limited. However, it is preferably 10 μm or less, for example, and more preferably 2 μm or less. If the average crystal grain size of the material for forming the dielectric substrate 24 is 10 μm or less, chipping or shedding during processing is small, and a groove 16 (described later) tends to be easily formed. The lower limit value of the average crystal grain size can be optionally selected, and 0.1 μm, 0.15 μm, 0.5 μm, or the like can be given as an example.

The electrode layer 26 is embedded in the interior of the dielectric substrate 24.

At an operating temperature of the electrostatic chuck device 10, the volume resistivity value of the electrode layer 26 is preferably $1.0 \times 10^6$ Ω·cm or less, and more preferably $1.0 \times 10^4$ Ω·cm or less.

The material for forming the electrode layer 26 can be optionally selected. However, it is preferably conductive ceramics. As the conductive ceramics, a composite sintered body of silicon carbide (SiC) and aluminum oxide ($Al_2O_3$), a composite sintered body of tantalum nitride (TaN) and aluminum oxide ($Al_2O_3$), a composite sintered body of tantalum carbide (TaC) and aluminum oxide ($Al_2O_3$), a composite sintered body of molybdenum carbide ($Mo_2C$) and aluminum oxide ($Al_2O_3$), or the like can be given as an example.

The thickness of the electrode layer 26 can be optionally selected. However, it may be in a range of 10 μm to 50 μm, for example.

The attraction member 3 has an electrostatic chuck portion 14 and a holding portion 15. The electrode layer 26 described above is disposed in the interior of each of the electrostatic chuck portion 14 and the holding portion 15.

In this embodiment, there is a case where the electrode layer disposed in the electrostatic chuck portion 14 of the attraction member 3 is referred to as an "electrode layer 26A". Further, there is a case where the electrode layer disposed in the holding portion 15 of the attraction member 3 is referred to as an "electrode layer 26B". When being simply referred to as an "electrode layer 26", it refers to both the electrode layer 26A and the electrode layer 26B.

The electrode layer 26A and the electrode layer 26B may be electrically connected to each other.

The upper surface of the electrostatic chuck portion 14 of the dielectric substrate 24 is made higher than the upper surface of the holding portion 15 of the dielectric substrate 24.

(Electrostatic Chuck Portion)

A power supply terminal 27 that energizes the electrode layer 26 is disposed in the electrostatic chuck portion 14. By energizing the electrode layer 26 from the power supply terminal 27, the electrostatic chuck portion 14 of the dielectric substrate 24 can exhibit an electrostatic attraction force. One end of the power supply terminal 27 is connected to the lower surface of the electrode layer 26A. On the other hand, the other end of the power supply terminal 27 is electrically connected to an external power source (not shown).

The periphery of the power supply terminal 27 is covered with an insulator 28. The insulator 28 shown in FIG. 1 is a cylindrical housing. The insulator 28 has a space which accommodates the power supply terminal 27 therein. In this way, the power supply terminal 27 is insulated from the outside of the insulator 28.

The upper surface (the surface on the +Z side) of the electrostatic chuck portion 14 of the dielectric substrate 24 is the mounting surface 11a described above. The mounting surface 11a may be circular when viewed in a plan view, and a disk-shaped wafer or the like can be mounted thereon.

(Holding Portion)

The holding portion 15 of this embodiment is formed in an annular shape so as to surround the mounting surface 11a.

The holding portion 15 is provided with the groove 16 and a plurality of through-holes 25.

The groove 16 is formed in an annular shape so as to surround the mounting surface 11a. A cooling gas is diffused in the grooves 16. The focus ring 12 is disposed on the upper surface (holding surface) of the holding portion 15. In this way, the focus ring is cooled from the portion which comes into contact with the cooling gas.

In the holding portion 15, upper surfaces on both sides of the groove 16 in the width direction are holding surfaces 15a that are in contact with the focus ring 12 and hold the focus ring 12. The holding surface 15a suppresses the cooling gas flowing in the groove 16 from leaking to the outside.

In this embodiment, there is a case where a band-shaped structure having the holding surface 15a is referred to as a seal band 17. The seal band 17 includes a seal band 17A that holds the focus ring on the outer side, and a seal band 17B that holds the focus ring further on the inner side than the seal band 17A. The seal band 17 is in contact with the focus ring 12 at the holding surface 15a to seal the cooling gas flowing in the groove 16 so as not to leak to the outside.

The plurality of through-holes 25 are open on a bottom surface 16a of the groove 16.

The holding portion 15 of this embodiment is formed by performing grinding processing (described later) on a raw material of the dielectric substrate 24, that is, on a structure having no holding portion.

[Cooling Base]

The cooling base 5 of this embodiment is provided in contact with the lower surface of the attraction member 3. The attraction member 3 and the cooling base 5 are bonded to each other by an adhesive such as silicone-based adhesive, for example. The cooling base 5 shown in FIG. 1 has a disk shape. The cooling base 5 is provided with a plurality of flow paths 29.

The flow path 29 preferably circulates a cooling medium such as water or an organic solvent. In this way, the heat of the attraction member 3 can be released to the cooling base 5, and thus the attraction member 3 can be cooled. As a result, the plate-shaped sample W mounted on the mounting surface 11a is cooled, and thus the temperature of the plate-shaped sample W can be kept low.

The material for forming the cooling base 5 can be optionally selected. However, it is not particularly limited as long as it is metal having excellent thermal conductivity, electrical conductivity, and workability, or a compound material containing the metal. For example, aluminum (Al), an aluminum alloy, copper (Cu), a copper alloy, stainless steel (SUS), titanium, or the like can be preferably used.

[Focus Ring]

The focus ring 12 is controlled to have substantially the same temperature as that of the plate-shaped sample W in a processing process such as plasma etching in a semiconductor manufacturing process.

The focus ring 12 of this embodiment is annularly disposed on the mounting table 11 of as to surround the mounting surface 11a. The focus ring 12 of this embodiment is disposed such that the entirety thereof overlaps the holding portion 15 when viewed in a plan view, and is held by the holding portion 15. The inner diameter of the focus ring 12 is larger than the diameter of the electrostatic chuck portion 14 of the attraction member 3. The focus ring 12 may have a stepped portion on the inner side of the upper surface.

In this embodiment, the focus ring 12 is provided along the circumferential direction of the holding portion 15 described above. Further, the focus ring 12 is provided along the circumferential direction of the groove 16 described above.

Since the focus ring 12 is easily electrostatically attracted to the mounting table 11, it is preferable that the volume resistivity of the material for forming the focus ring 12 is low. Further, since the temperature of the focus ring 12 can be easily controlled, it is preferable that the material for forming the focus ring 12 has high thermal conductivity. As the material for forming the focus ring 12 having such characteristics, ceramics can be given as an example. For example, in a case where the electrostatic chuck device 10 is used for oxide film etching, polycrystalline silicon, silicon carbide, or the like is suitably used for the material for forming the focus ring 12.

The surface roughness of the portion (surface) of the focus ring 12, which comes into contact with the holding portion, can be optionally selected. However, it is preferably 0.05 μm or less, and more preferably 0.01 μm or less. Further, the flatness of the portion (surface) can be optionally selected. However, it is preferably 20 μm or less, and more preferably 15 μm or less.

[Cooling Element]

The cooling element 13 of this embodiment includes a plurality of insulators (glass members) 32. The insides of the plurality of insulators 32 are gas flow paths 20, respectively.

The plurality of gas flow paths 20 supply a cooling gas to the groove 16. The cooling gas which is used in this embodiment can be optionally selected, and He gas can be given as an example.

A cooling gas supply source 22 for supplying the cooling gas is connected to the plurality of gas flow paths 20 through a pressure control valve 23. The pressure control valve 23 adjusts a flow rate such that the pressure of the cooling gas reaches a predetermined pressure. The number of the gas flow paths 20 for supplying the cooling gas from the cooling gas supply source 22 may be one or may be a plurality of two or more.

The cooling element 13 supplies the cooling gas to the groove 16 through one or a plurality of gas flow paths 20. In this way, the cooling element 13 can cool the focus ring 12.

The plurality of insulators 32 of this embodiment are inserted into the plurality of through-holes 25. The plurality of insulators 32 are tubular housings. Further, the end portions of the plurality of insulators 32 are gas holes 21 that are open on the bottom surface 16a of the groove 16 and communicate with the groove 16. The plurality of gas holes 21 are discretely formed on the bottom surface 16a of the groove 16.

The material for forming the plurality of insulators 32 can be optionally selected. However, a material having insulating properties and mechanical strength is preferable. Further, it is preferable that the thermal conductivity of the material for forming the insulator 32 is the same as the thermal conductivity of the material for forming the dielectric substrate 24. As the material for forming the plurality of insulators 32 having such characteristics, ceramics can be given as an example. As a preferable example of the ceramics which is used as the material for forming the plurality of insulators 32, aluminum oxide ($A_l2O_3$) can be given.

As a result of the studies conducted by the inventors, it was found that there is a case where a continuous and periodic concavo-convex structure (waviness) is formed on the surface of the holding portion 15 due to grinding processing.

In particular, the waviness formed on the holding surface 15a is presumed to become a factor for leaking the cooling gas. Therefore, in the electrostatic chuck device 10 of this embodiment, it is required to control the waviness of the holding surface 15a.

The holding surface 15a of this embodiment has a surface roughness of 0.05 μm or less. Hereinafter, there is a case where this is referred to as a condition (i). The surface roughness of the holding surface 15a is preferably 0.02 μm or less.

The surface roughness in this specification is so-called centerline average surface roughness Ra. The surface roughness in this specification is measured using a surface roughness profile measuring instrument (SURFCOM 1500SD3 manufactured by Tokyo Seimitsu Co., Ltd.) according to JIS B0601. In this measurement, the surface roughness of the upper surfaces (holding surfaces) 15a of the outer side 17A and the inner side 17B of the groove 16 in the width direction is measured at a total of six points by three points every 120° on concentric circumferences, and the average value thereof is adopted.

The holding surface 15a of this embodiment has a flatness of 20 μm or less. Hereinafter, there is a case where this is referred to as a condition (ii). The flatness of the holding surface 15a is preferably 15 μm or less.

The flatness in this specification is measured using a three-dimensional measuring machine (RVA800A manufactured by Tokyo Seimitsu Co., Ltd.) according to JIS B 6191. In this measurement, first, the three-dimensional coordinates of the upper surfaces (holding surfaces) 15a of the outer side 17A and the inner side 17B of the groove 16 in the width direction are measured at a total of 16 points by 8 points every 45° on concentric circumferences. Next, a least-squares plane in which the sum of squares from each measurement point is the smallest is obtained using these measured values by a least-squares method. The sum of the absolute values of the lengths of the farthest point on the upper side and the farthest point on the lower side of the least-squares plane is adopted.

Further, in the waviness which is formed on the holding surface 15a described above, the maximum value and the minimum value of the height of the holding surface are alternately repeated. Here, the maximum value of the waviness in the holding portion 15 refers to the maximum value in the +Z direction, which is locally observed in the width direction of the holding portion 15. Further, the minimum value of the waviness in the holding portion 15 refers to the maximum value in the −Z direction, which is locally observed in the width direction of the holding portion 15.

It is presumed that the longer the cycle in which the maximum value and the minimum value described above are repeated is, the more easily the electrostatically attracted focus ring 12 follows the waviness of the holding surface 15a. The focus ring 12 follows the waviness of the holding surface 15a, so that it is possible to reduce a gap in the seal band 17 of the holding portion 15 and reduce the leak amount of the cooling gas. Being able to easily follow the waviness means that it is easier to reduce the gap between the focus ring and the holding surface. It is preferable that the surface of the holding surface has no waviness. However, by controlling the value of the waviness of the surface, a desired result can be obtained even if there is a waviness.

In this embodiment, it is preferable that the cycle of the waviness which is formed on the holding surface 15a is 60 degrees (°) or more. It is considered that the cycle of the waviness is 60 degrees or more, whereby the focus ring 12 can sufficiently follow the unevenness of the holding surface 15a. The cycle of the waviness may be an angle formed by the positions of the maximum values adjacent to each other and the center of an annulus. The cycle can be obtained from, for example, a surface profile (described later).

As a result of the studies conducted by the inventors, even if the requirements described above were satisfied, there were a case where the surface temperature of the plate-shaped sample W could be uniformly controlled, and a case where it could not be controlled. Through evaluation and observation, it was confirmed that in a case where the temperature cannot be controlled, a recess which is minute within a range shorter than the cycle of the waviness was formed on the holding surface 15a. As will be described later, this recess is presumed to be formed due to the influence of the insulator 32.

In the electrostatic chuck device 10 of this embodiment, the holding surface 15a does not have a recess having a depth of 1.0 μm or more and extending in a direction intersecting the circumferential direction of the holding portion 15. Hereinafter, there is a case where this is referred to as a condition (iii).

If there is a recess having a depth of 1.0 μm or more and extending in the direction intersecting the circumferential direction of the holding portion 15, the focus ring 12 is difficult to follow the recess, and there is a concern that the cooling gas may leak from this recess. In the electrostatic chuck device 10 of this embodiment, since there is no such recess having a depth of 1.0 μm or more, it is possible to reduce the leak amount of the cooling gas.

The depth of the recess in the present specification is obtained from the surface profile which is measured by the following method. A three-dimensional measuring machine (RVA800A manufactured by Tokyo Seimitsu Co., Ltd.) is used for the measurement of the surface profile. The surface profile can be obtained by measuring a total of 360 points by 360 points every 1° on concentric circumferences with respect to three-dimensional coordinates of the upper surface (holding surface) 15a on the outer side 17A in the width direction of the groove 16. When a perpendicular is drawn from a tangent line connecting the tops of peaks adjacent to each other toward a valley within a range of 60° of the cycle of the waviness by using the surface profile, the distance from the tangent line to the valley is defined as the depth of the recess in this specification. The two peaks adjacent to each other are peaks which are included in the range of 60°. That is, the angle from one peak to the other peak from the center is included in the range of 60°. In a case where the peaks adjacent to each other are not within the range of 60°, it is determined that there is no recess in this range.

As described above, the holding surface 15a satisfies the conditions (i) to (iii), whereby it is possible to reduce the gap between the holding surface 15a of the holding portion 15 and the focus ring 12. In this way, it is possible to reduce the amount of the cooling gas leaking from the gap. As a result, in this embodiment, it becomes easy to control the pressure of the cooling gas. Therefore, in the electrostatic chuck device 10, the temperature of the focus ring 12 can be easily controlled, and it is possible to make the surface temperature of the plate-shaped sample W uniform.

According to the configuration described above, an electrostatic chuck device can be provided in which it is possible to make the surface temperature of the plate-shaped sample uniform.

<Method for Producing Electrostatic Chuck Device>

A production method for obtaining the electrostatic chuck device 10 described above will be described with reference to FIGS. 3 to 5.

The method for producing the electrostatic chuck device 10 of this embodiment includes a first grinding step, a step of forming the groove 16, and a second grinding step. As steps other than the first grinding step, the step of forming the groove 16, and the second grinding step, steps which are performed in known methods for producing an electrostatic chuck device can be performed.

Figure 3:
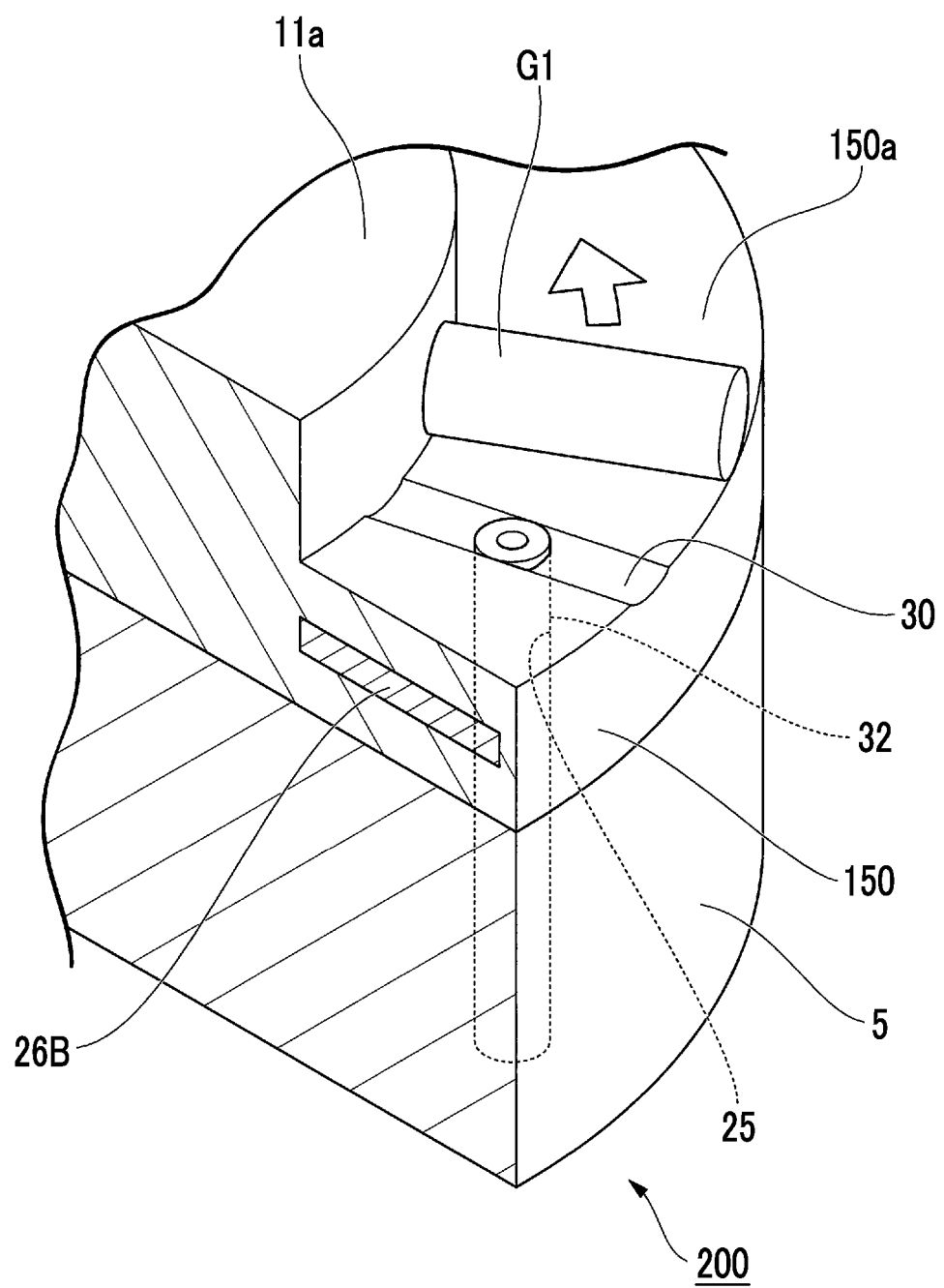
FIG. 3 is a schematic perspective view showing a first grinding step of the present embodiment.

FIG. 3 is a schematic perspective view showing the first grinding step of this embodiment. In the first grinding step of this embodiment, a temporary mounting table 200 is ground while rotating a cylindrical first grindstone G1.

The temporary mounting table 200 has a sintered body 150, the plurality of tubular insulators 32, and the cooling base 5. The sintered body 150 is provided with the mounting surface 11a (refer to FIG. 1) on which the plate-shaped sample W is mounted. The plurality of through-holes 25 are provided around the mounting surface 11a. The through-holes 25 may be provided in any number and position. The through-holes 25 may be provided at equal intervals. Further, the sintered body 150 is provided with the electrode layer 26B. In the temporary mounting table 200, the sintered body 150 and the cooling base 5 are bonded to each other with an adhesive (not shown) such as a silicone-based adhesive.

On the other hand, the plurality of tubular insulators 32 are inserted into the through-holes 25 described above.

In the first grinding step of this embodiment, with respect to the temporary mounting table 200 in which one end of each of the plurality of insulators 32 is exposed on the surface of the sintered body 150, a surface 150a around the mounting surface 11a together with one end of each of the plurality of insulators 32 is ground in an annular shape.

Before the first grinding step, the upper main surface of the sintered body 150 of the temporary mounting table 200 may be a flat surface without a step. For example, by performing the first grinding step, one continuous step surrounding the mounting surface 11a can be formed. The step can have a side surface of the mounting surface 11a and one bottom surface (holding surface) that is annular when viewed in a plan view. Alternatively, before the first grinding step, a mounting surface may be provided on the upper main surface of the sintered body 150 of the temporary mounting table 200.

In the first grinding step of this embodiment, for example, a rotary grinder or the like can be used.

In the first grinding step of this embodiment, the temporary mounting table 200 is ground such that the surface 150a around the mounting surface 11a preferably satisfies the following conditions (i) and (ii).

(i) The surface roughness is 0.05 μm or less.
(ii) The flatness is 20 μm or less.

Usually, if a sintered body is ground with a grindstone, grinding heat is generated. The higher the peripheral velocity of the first grindstone G1 is, the larger the amount of heat generation becomes. If the amount of heat generation increases, there is a case where the above-mentioned adhesive between the sintered body and the cooling base cures and shrinks. Due to the curing and shrinkage, there is a case where a waviness occurs on the surface 150a of the sintered body 150. As a result, there is a case where the flatness of the surface 150a decreases.

It is favorable if the peripheral velocity of the first grindstone G1 is set to such velocity that the surface 150a satisfies the conditions (i) and (ii), by performing a preliminary experiment.

As a result of the studies conducted by the inventors, it was found that even if the conditions (i) and (ii) are satisfied in the first grinding step of this embodiment, there is a case where the minute recess 30 described above is formed on the surface 150a around the mounting surface 11a. The inventors consider the following as a factor for forming the recess 30.

In the first grinding step of this embodiment, the insulator 32 and the sintered body 150 are ground simultaneously at a portion where one end of the insulator 32 is exposed on the surface of the sintered body 150. Further, the insulator 32 does not have an object to be ground at the inside thereof. On the other hand, only the sintered body 150 is ground at a portion where one end of the insulator 32 is not exposed on the surface of the sintered body 150.

In this manner, even in the temporary mounting table 200, the object to be ground differs depending on the position to be ground. Therefore, it is considered that some portions of the temporary mounting table 200 are easily ground and some portions are difficult to be ground. In this embodiment, it is presumed that this difference is manifested as the minute recess 30.

Figure 4:
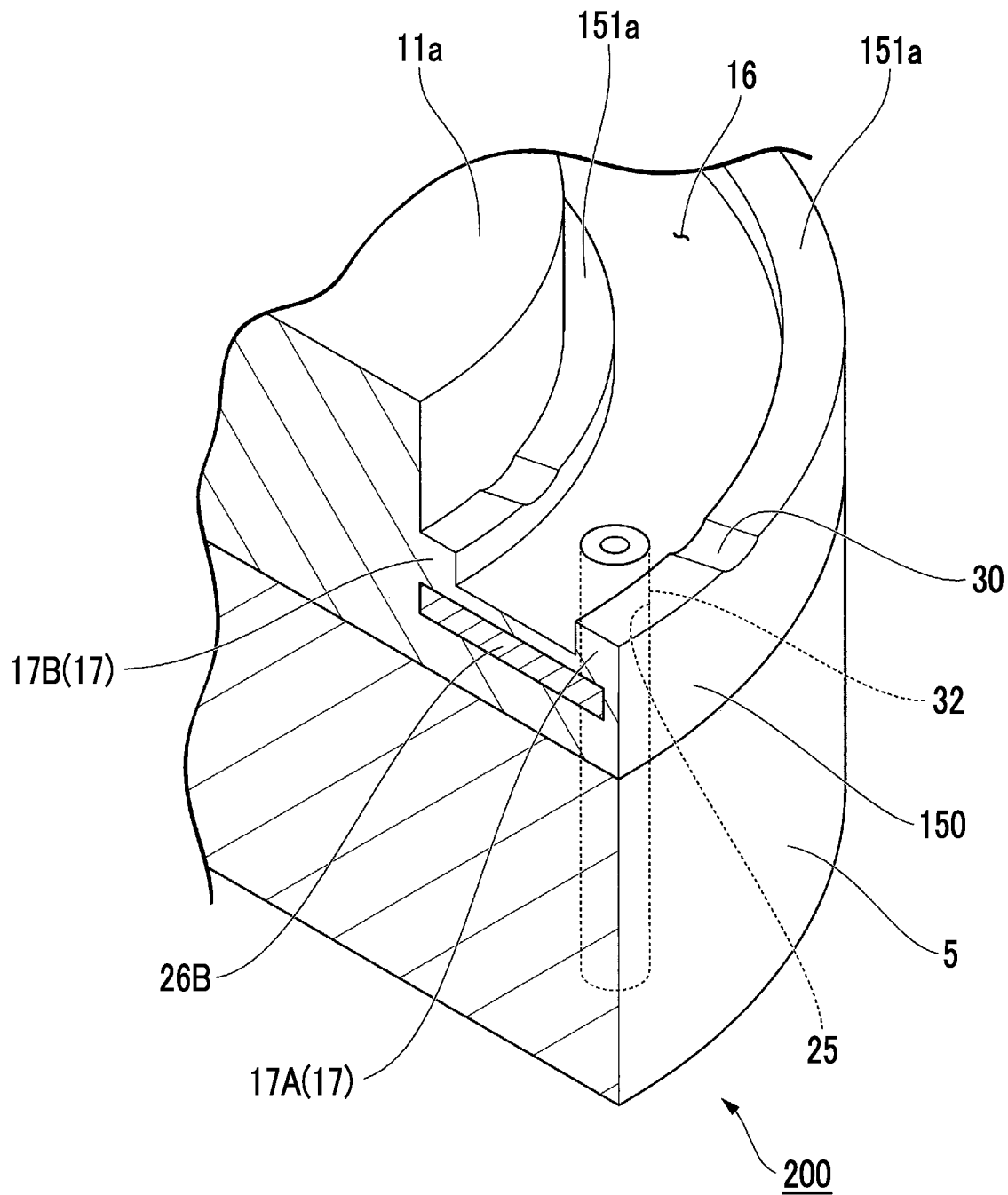
FIG. 4 is a schematic perspective view showing a step of forming a groove 16 of the present embodiment.

FIG. 4 is a schematic perspective view showing the step of forming the groove 16 of this embodiment. In the step of forming the groove 16 of this embodiment, after the first grinding step, the insulator 32 exposed on the holding surface and the sintered body 150 around the insulator 32 are dug down to form the groove 16 surrounding the mounting surface 11a. At this time, the two upper surfaces (both) of the holding surface, which sandwich the groove 16 therebetween, are not dug down. As shown in FIG. 4, when viewed in a plan view, a through-hole or a conduit into which an insulator is inserted is not included below the holding surface. In the step of forming the groove 16 of this embodiment, processing which is optionally selected can be performed, for example, rotary processing, blast processing, or the like can be used, and the blast processing can be preferably used.

As a medium which is used for the blast processing, aluminum oxide (alumina, $Al_2O_3$), silicon carbide, glass beads, or the like is preferably used. The medium is preferably 400 mesh under (passing through 300 mesh). The discharge pressure of the medium in the blast processing is preferably 0.1 MPa or less, for example, and more preferably 0.05 MPa or less.

Figure 5:
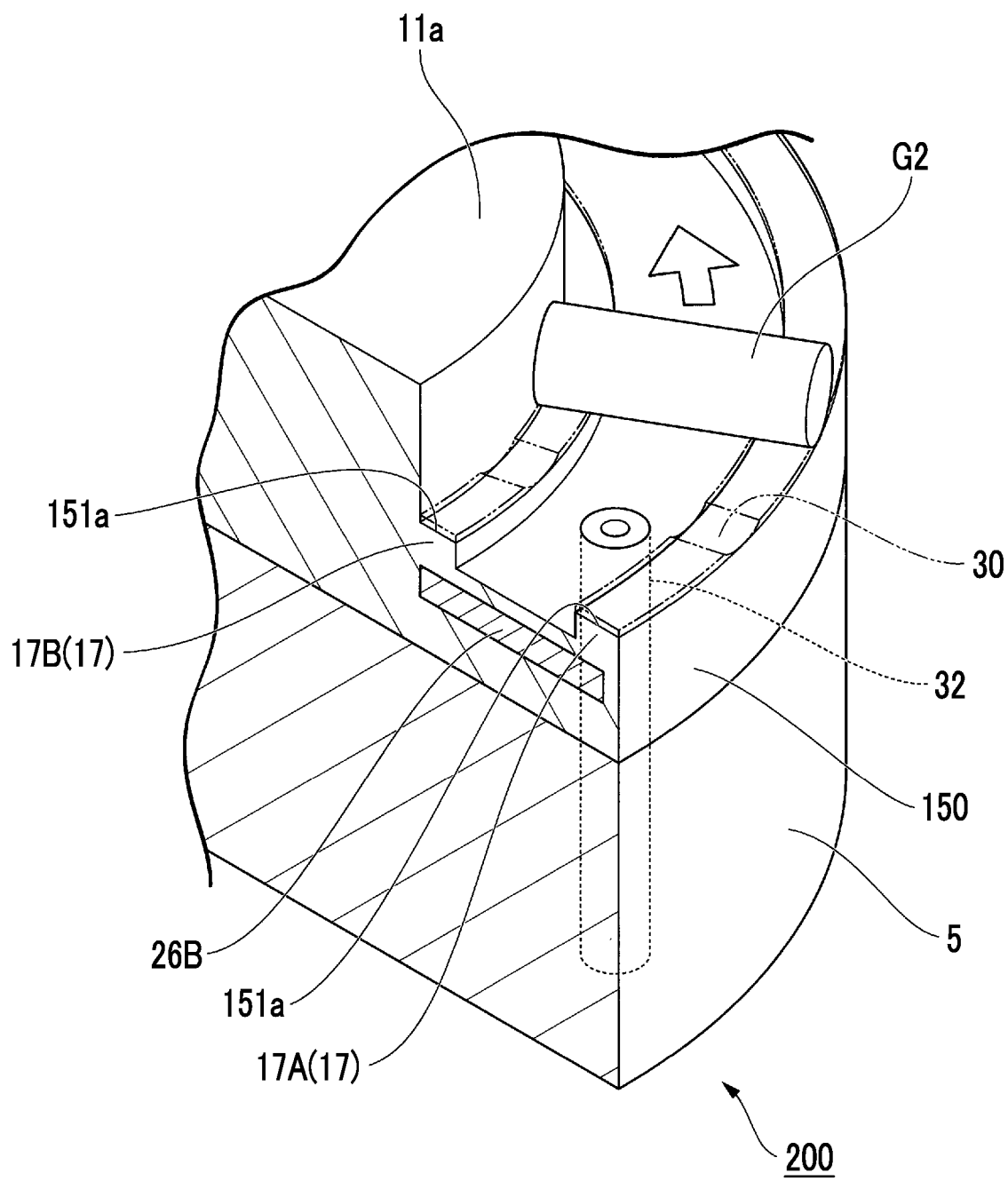
FIG. 5 is a schematic perspective view showing a second grinding step of the present embodiment.

FIG. 5 is a perspective view showing the second grinding step of this embodiment. In the second grinding step of this embodiment, upper surfaces (holding surfaces) 151a of the seal bands 17A and 17B on both sides of the groove 16 in the width direction are ground again while rotating a cylindrical second grindstone G2. The second grindstone G2 may be the same as or different from the first grindstone G1.

In the second grinding step of this embodiment, for example, a rotary grinder or the like can be used.

In the second grinding step of this embodiment, the upper surfaces 151a of the seal bands 17A and 17B on both sides of the groove 16 in the width direction are ground. In this way, the minute recess 30 formed in the first grinding step described above is flattened. In the second grinding step of this embodiment, the upper surfaces 151a of the seal bands 17A and 17B on both sides of the groove 16 in the width direction are ground so as to satisfy the conditions (i) and (ii). As a result, the obtained holding surface 15a of the electrostatic chuck device 10 satisfies the following condition (iii) while satisfying the conditions (i) and (ii).

(iii) The holding surface does not have the recess 30 having a depth of 1.0 μm or more and extending in the direction intersecting the circumferential direction of the focus ring 12.

The length or width of the recess is not limited, and may be any value that allows the measurement of the depth.

In the second grinding step of this embodiment, it is preferable to use a grindstone in which the length of the grindstone in a rotation axis direction thereof is longer than the length of the groove 16 in the width direction. In this way, the holding surfaces 151a can be selectively ground merely by bringing the second grindstone G2 into contact with the holding portion 15. The length of the second grindstone G2 in the rotation axis direction is preferably longer than at least one upper surface of the holding portion, and more preferably, is the same as or larger than the entire width of the holding portion (the total of the widths of the two upper surfaces and the width of the groove).

Similar to the first grindstone G1 which is used in the first grinding step, the higher the peripheral velocity of the second grindstone G1 is, the larger the amount of heat generation becomes. If the amount of heat generation increases, there is a case where the adhesive described above cures and shrinks. Due to the curing and shrinkage, there is a case where a waviness occurs on the holding surface 151a. As a result, there is a case where the flatness of the holding surface 151a decreases.

It is favorable if the peripheral velocity of the second grindstone G2 is set to such velocity that the holding surface 151a satisfies the conditions (i) to (iii), by performing a preliminary experiment.

Further, as described above, grinding processing may be performed so as to satisfy the conditions (i) and (ii) in the first grinding step. However, grinding processing can be performed so as to satisfy the conditions (i) and (ii) in the second grinding step. In the latter case, it is favorable if a grindstone in which the length thereof in the rotation axis direction is substantially the same as the entire width of the holding portion 15 is used as the second grindstone G2 such that the seal bands 17A and 17B have the same surface state.

According to the method as described above, the holding surface 15a of the obtained electrostatic chuck device 10 satisfies the conditions (i) to (iii). As a result, it is possible to produce an electrostatic chuck device in which it is possible to make the surface temperature of the plate-shaped sample uniform.

Various embodiments of the present invention have been described above. However, the respective configurations, a combination thereof, and the like in each embodiment are examples, and addition, omission, replacement, and other changes of a configuration can be made within a scope which does not depart from the gist of the present invention. Further, the present invention is not limited by the embodiments.

In the electrostatic chuck device 10 of this embodiment, the example is shown in which the end portions of the plurality of insulators 32 are open on the bottom surface 16a of the groove 16. However, there is no limitation thereto. In the electrostatic chuck device according to one aspect of the present invention, it is favorable if the plurality of insulators overlap the bottom surface of the groove in a plan, when the groove is viewed in a plan view. For example, the end portion of the insulator 32 may not be open on the bottom surface 16a of the groove 16 and can be located in the interior of the holding portion 15.

Figure 6:
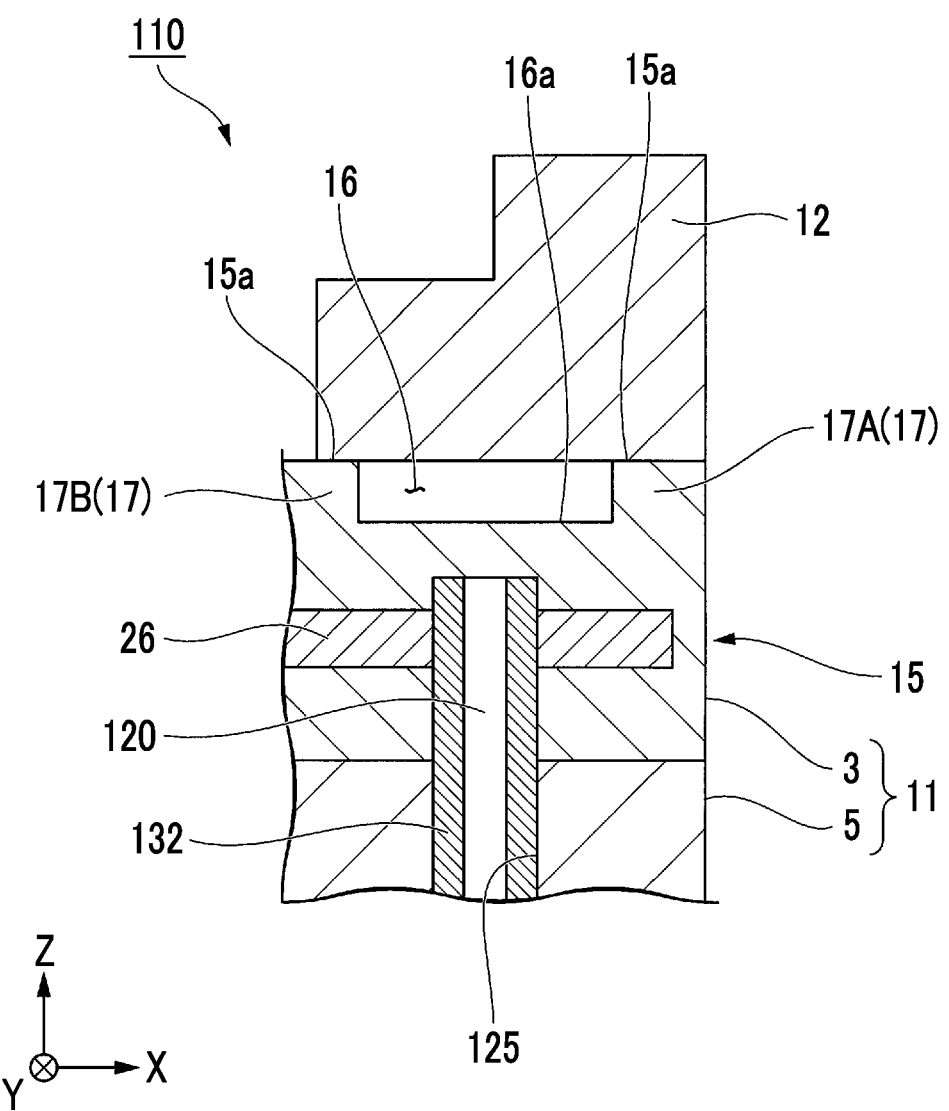
FIG. 6 is a schematic sectional view on the XZ plane, showing a modification example of the electrostatic chuck device of the present embodiment.

A modification example of the electrostatic chuck device of this embodiment will be described with reference to FIG. 6. FIG. 6 is a schematic sectional view on the XZ plane, showing the modification example of the electrostatic chuck device of this embodiment. FIG. 6 is a diagram corresponding to FIG. 2. The electrostatic chuck device 10 of FIG. 6 is different from the electrostatic chuck device 10 of FIG. 2 in that the holding portion 15 of an electrostatic chuck 110 is provided with a plurality of conduits 125 which extends in the thickness direction (Z direction) of the holding portion 15, and in which the end portion is not open on the bottom surface 16a of the groove 16. An internal space 120 of each of the plurality of conduits 125 is used for the purpose of passing wiring or the like, which is electrically connected to the electrode layer 26.

In the groove 16 in FIG. 6, for example, a cooling gas which is supplied from a pipe other than the conduit 125 may flow therein. The example of the pipe for supplying the cooling gas is not particularly limited. For example, a through-hole or the like, into which a tubular glass is inserted and which is open on the bottom surface of the groove, as shown in FIG. 2, may also be used for the electrostatic chuck device of FIG. 6.

A plurality of insulators 132 are inserted in the plurality of conduits 125, respectively. The end portions of the plurality of insulators 132 are not exposed on the bottom surface 16a of the groove 16. The bottom surface 16a of the groove 16 and the conduit 125 overlap each other in a plan, that is, they overlap each other when viewed in a plan view.

In the temporary mounting table 200 which is used in the method for producing the electrostatic chuck device 10 of this embodiment, one end of each of the plurality of insulators 32 is exposed on the surface of the sintered body 150. However, there is no limitation thereto.

For example, the sintered body 150 of the temporary mounting table 200 may be used in which although it includes a plurality of conduits which extends in the thickness direction, into which insulators are inserted, and whose one end is not exposed on the surface (ground surface), it does not have through-holes. By using such a temporary mounting table 200, a through-hole may be formed by a grinding step and one end of each of the conduit and the glass may be exposed on the surface in the groove, as shown in FIG. 2, alternatively, even if a grinding step is performed, the conduit and the glass may not be exposed on the surface in the groove, as shown in FIG. 6. A holding portion including both the through-hole and the conduit may be formed by a grinding step by changing the height, length, or position of the conduit whose one end is not exposed, in the temporary mounting table 200.

The sintered body 150 of the temporary mounting table 200 may have a through-hole into which a glass is inserted partway and the glass is not exposed on the surface. By a grinding step, one end of each of the through-hole and the glass may be exposed on the surface in the groove, as shown in FIG. 2, or only the through-hole may be exposed on the surface in the groove.

Alternatively, the temporary mounting table 200 may be used which includes both the through-hole that is exposed on the surface and the conduit that is not exposed, and the glass inserted into these. In a case where the formed electrostatic chuck device includes both the through-hole and the conduit as described above, these may communicate with each other or may not communicate with each other.

In the temporary mounting table which is used in the method for producing an electrostatic chuck device according to an aspect of the present invention, it is favorable if a plurality of insulators overlap the surface of the sintered body around the mounting surface in a plan, when the sintered body around the mounting surface is viewed in a plan view. In a case where the electrostatic chuck device 10 shown in FIG. 1 is produced using such a temporary mounting table, one end of each of the plurality of insulators 32 together with the sintered body 150 can be processed in at least one of the first grinding step and the second grinding step.

The method for producing the electrostatic chuck device 110 of FIG. 6 will be described. In the temporary mounting table which is used in the method for producing the electrostatic chuck device 110, one end of each of the plurality of insulators 132 is not exposed on the surface of the sintered body 150. Around the mounting surface 11a of such a temporary mounting table, the elastic modulus is different between a region where the plurality of insulators 132 are present and a region where the plurality of insulators 132 are not present, when viewed in a plan view. Therefore, if the first grindstone G1 or the second grindstone G2 is pressed against the ground surface of the sintered body 150 during the first grinding step or the second grinding step, there is a case where a difference occurs in the amount of deformation in the thickness direction (Z-axis direction) of each region. Therefore, it is considered that minute recesses are formed on the surface 150a around the mounting surface 11a due to the difference in the amount of deformation. According to the production method as described above, it is possible to suppress the formation of the minute recesses on the surface 150a around the mounting surface 11a.

In a case of producing the electrostatic chuck device 110 shown in FIG. 6, a material in which one end of each of the plurality of insulators 132 is not exposed on the surface of the sintered body 150 is used for the temporary mounting table. In the first grinding step and the second grinding step, one end of each of the plurality of insulators 132 together with the sintered body 150 is not processed.

For example, the holding portion 15 described above may be provided with a heater (not shown). In this way, by heating the focus ring 12, it is possible to control the temperature of the focus ring 12 to substantially the same temperature as that of the plate-shaped sample W.

Figure 9:
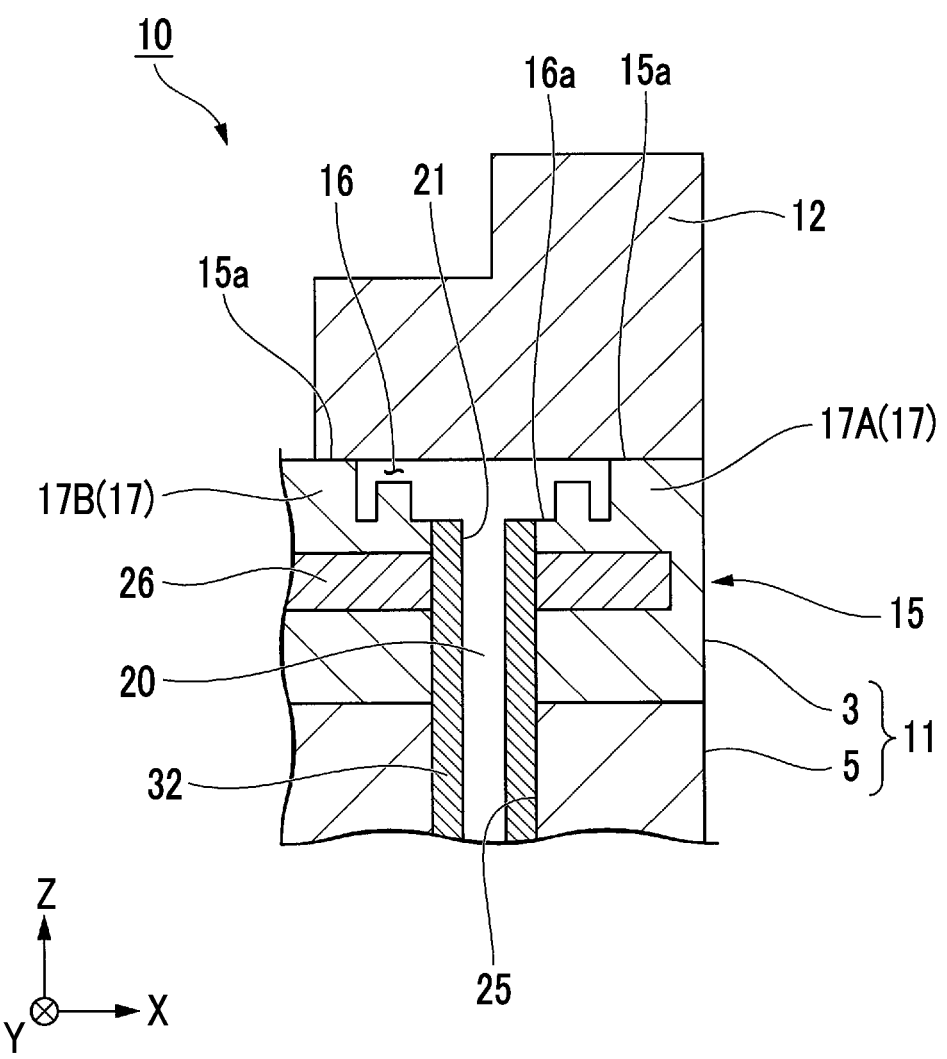
FIG. 9 is a schematic partial enlarged view showing a modification example of the area shown in FIG. 2.

As shown in FIG. 9, the bottom surface 16a of the groove 16 may have a protrusion portion which is formed of the same material as the dielectric substrate 24 and provided lower than the holding surface 15a. The shape or size of the protrusion portion can be optionally selected. In this way, it is possible to improve the electrostatic attraction of the holding portion 15 without hindering the flow of the cooling gas. As a result, the surface temperature of the focus ring 12 (or the plate-shaped sample W) can be cooled uniformly.

EXAMPLE

The present invention will be described below with reference to examples. However, the present invention is not limited to these examples. In the following examples, He gas was used as the cooling gas.

[Measurement of Surface Roughness]

The surface roughness was measured using a surface roughness profile measuring instrument (SURFCOM 1500SD3 manufactured by Tokyo Seimitsu Co., Ltd.) according to JIS B0601. In this measurement, the surface roughness of the upper surfaces (holding surfaces) of the inner side and the outer side of the groove in the width direction was measured at a total of six points by three points every 120° on concentric circumferences, and the average value thereof was adopted.

[Measurement of Flatness]

The flatness was measured using a three-dimensional measuring machine (RVA800A manufactured by Tokyo Seimitsu Co., Ltd.) according to JIS B 6191. In this measurement, first, the three-dimensional coordinates of the upper surfaces (holding surfaces) of the inner side and the outer side of the groove in the width direction were measured at a total of 16 points by 8 points every 45° on concentric circumferences. Next, a least-squares plane in which the sum of squares from each measurement point is the smallest was obtained using these measured values by a least-squares method. The sum of the absolute values of the lengths of the farthest point on the upper side and the farthest point on the lower side of the least-squares plane was adopted.

[Measurement of Depth of Recess]

Figure 7:
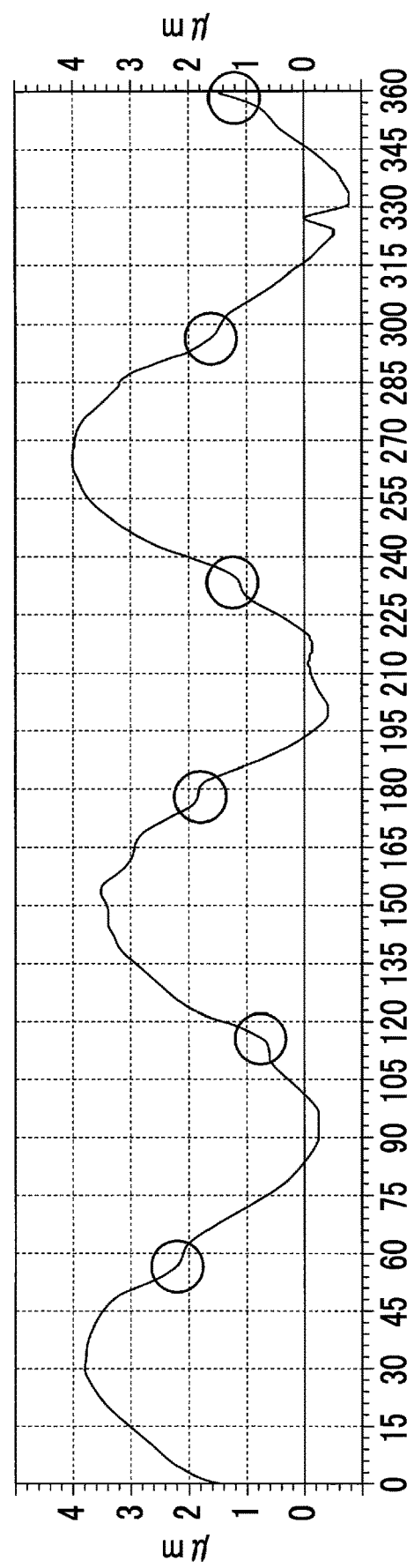
FIG. 7 is a graph showing the surface shapes of upper surfaces (holding surfaces) on both sides of the groove in a width direction in Example 1.
Figure 8:
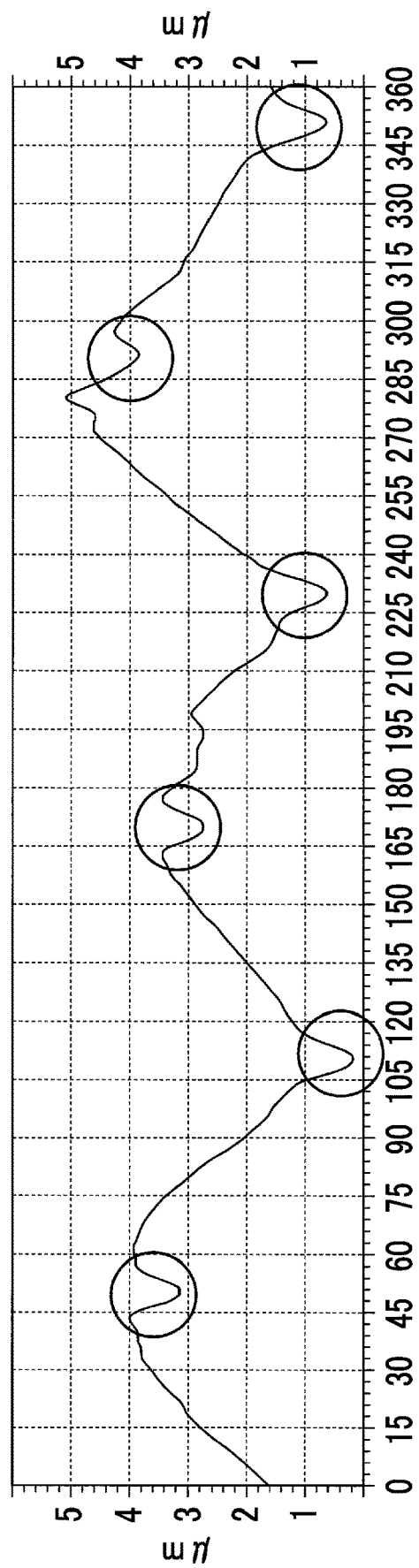
FIG. 8 is a graph showing the surface shapes of the upper surfaces on both sides of the groove in the width direction in Comparative Example 1.

The depth of the recess was obtained from the surface profile which is measured by the following method. A three-dimensional measuring machine (RVA800A manufactured by Tokyo Seimitsu Co., Ltd.) was used for the measurement of the surface profile. The three-dimensional coordinates of the upper surface (holding surface) on the outer side and the upper surface (holding surface) on the inner side of the groove in the width direction were measured. Specifically, the surface profile was obtained by measuring a total of 360 points by 360 points every 1° on a circumference. When a perpendicular was drawn from a tangent line connecting the tops of peaks adjacent to each other toward a valley within the range of 60° of the cycle of the waviness by using the surface profile, the distance from the tangent line to the valley was defined as the depth of the recess. The surface profiles are shown in FIGS. 7 and 8. In a case where the peaks adjacent to each other are not within the range of 60°, it was determined that there is no recess in this range. It was confirmed that even if a plurality of measurements were performed at different positions on the concentric circumferences and the position was changed, similar results could be obtained.

[Evaluation of Leak Amount of He Gas]

The electrostatic chuck device was mounted on a plasma etching apparatus, and a silicon wafer (ring-shaped sample) having a diameter of 350 mm was attracted and fixed to the mounting surface of the electrostatic chuck device with an applied direct-current voltage of 2.5 kV. At this time, He gas was introduced through the gas holes at a pressure of 6.66 kPa, and the leak amount of He gas was measured under the condition of vacuum (<0.5 Pa) and evaluated.

In this evaluation, a case where the leak amount of He gas is 1 sccm or less was evaluated as "○" (acceptable).

Further, a case where the leak amount of He gas exceeds 1 sccm was evaluated as a defective product and was designated as "x" (unacceptable).

1 sccm represents a gas flow rate (unit: cm$^3$) per minute under the condition of 0.1 MPa and 0° C.

<Production of Electrostatic Chuck Device>

Example 1

A sintered body (ø50 mm, made of $Al_2O_3$—SiC) was prepared in which a plurality of through-holes were provided around the portion serving as the mounting surface of the mounting table. This sintered body was laminated on a cooling base (made of aluminum) in which a plurality of through-holes were provided at positions overlapping the through-holes of the sintered body in a plan, with a silicone-based adhesive interposed therebetween. By heating this laminated body at 100° C. for 5 hours, the sintered body and the cooling base were bonded to each other.

Cylindrical members having the same diameter were used for the sintered body and the cooling base.

Next, a plurality of insulators (made of $Al_2O_3$) were inserted into through-holes composed of the through-holes of the sintered body and the through-holes of the cooling base to obtain a temporary mounting table.

Next, the surface portion of the sintered body around the portion serving as the mounting surface was ground into an annular shape by a rotary grinder using a silicon carbide grindstone No. 1000 (first grindstone) (first grinding step). By this grinding, a holding surface for holding the focus ring was formed. The through-hole into which the insulator was inserted was included in the ground portion. The larger the number of the silicon carbide grindstone is, the smaller the abrasive grains become. Further, the peripheral velocity (rotational speed) of the grindstone in the first grinding step was set to 80 m/s.

Next, blast processing was performed on the ground surface (holding surface) around the mounting surface, and thus the insulator and the sintered body around the insulator were dug down to form a groove surrounding the mounting surface (step of forming a groove). The blast processing was performed using a silicon carbide medium (400 mesh under (passing through 300 mesh)) under the condition of a discharge pressure of 0.03 MPa.

Further, the upper surfaces on both sides in the width direction of the formed groove were ground again by a rotary grinder using a silicon carbide grindstone No. 1000 (second grindstone) (second grinding step). Further, the peripheral velocity of the grindstone in the second grinding step was set to 80 m/s. In this way, the electrostatic chuck device was produced.

The surface roughness, the flatness, and the depth of the recess were measured with respect to the upper surface (holding surface) in the width direction of the groove obtained after the second grinding step.

Example 2

The same procedure as in Example 1 was performed except that the peripheral velocity of the grindstone in the first grinding step and the second grinding step was set to 100 m/s.

Example 3

The same procedure as in Example 1 was performed except that the peripheral velocity of the grindstone in the first grinding step and the second grinding step was set to 110 m/s.

Example 4

The same procedure as in Example 2 was performed except that the silicon carbide grindstone No. 600 was used as each of the first grindstone and the second grindstone.

Comparative Example 1

The same procedure as in Example 1 was performed except that the second grinding step was not performed.

The surface roughness, the flatness, and the depth of the recess were measured with respect to the upper surface (holding surface) in the width direction of the groove obtained after the step of forming the groove.

Comparative Example 2

The same procedure as in Example 3 was performed except that the second grinding step was not performed.

The surface roughness, the flatness, and the depth of the recess were measured with respect to the upper surface (holding surface) in the width direction of the groove obtained after the step of forming the groove.

The evaluation results of the examples and the comparative examples are shown in FIGS. 7 and 8 and Table 1. FIG. 7 is a graph showing the surface shapes of the upper surfaces (holding surfaces) on both sides in the width direction of the groove in Example 1. FIG. 8 is a graph showing the surface shapes of the upper surfaces on both sides in the width direction of the groove in Comparative Example 1. The vertical axis in FIGS. 7 and 8 is the height of the holding surface with the first measurement point as a reference. Further, the horizontal axis is the cycle of the waviness.

TABLE 1

| | Surface roughness (μm) | Flatness (μm) | Recess having depth of 1 μm or more | Leak amount of He gas (sccm) | Evaluation |
|---|---|---|---|---|---|
| Example 1 | 0.015 | 5 | No | 0.5 | ○ |
| Example 2 | 0.015 | 15 | No | 0.6 | ○ |
| Example 3 | 0.015 | 20 | No | 1.0 | ○ |
| Example 4 | 0.050 | 15 | No | 1.0 | ○ |
| Comparative Example 1 | 0.015 | 5 | With | 3.5 | X |
| Comparative Example 2 | 0.015 | 20 | with | 4.6 | X |

As shown in Table 1, it was found that in the electrostatic chuck devices of Examples 1 to 4 which satisfy the following conditions (i) to (iii), the leak amount of the He gas was 1 sccm or less and the leak amount of the He gas was small. From this, it is considered that in the electrostatic chuck devices of Examples 1 to 4, the pressure of the He gas is easily controlled and it is possible to make the surface temperature of the wafer uniform.

(i) The surface roughness is 0.05 μm or less.

(ii) The flatness is 20 μm or less.

(iii) The holding surface does not have a recess having a depth of 1.0 μm or more and extending in the direction intersecting the circumferential direction of the focus ring.

On the other hand, it was found that in the electrostatic chuck devices of Comparative Example 1 and Comparative Example 2 which do not satisfy the conditions (i) to (iii), the leak amount of the He gas exceeds 1 sccm and the leak amount of the He gas is large. From this, it is considered that in the electrostatic chuck devices of Comparative Example 1 and Comparative Example 2, it is difficult to control the pressure of the He gas and it is difficult to make the surface temperature of the wafer uniform.

From the above results, it was confirmed that the present invention is useful.

INDUSTRIAL APPLICABILITY

Provided is an electrostatic chuck device in which it is possible to make the surface temperature of a plate-shaped sample uniform.

REFERENCE SIGNS LIST

3: attraction member
5: cooling base
10, 110: electrostatic chuck device
11: mounting table
11a: mounting surface
12: focus ring
13: cooling element
14: electrostatic chuck portion
15: holding portion
15a, 151a: upper surface (holding surface)
16: groove
16a: bottom surface
17: seal band
17A: seal band (outer side)
17B: seal band (inner side)
20: gas flow path
21: gas hole
22: cooling gas supply source
23: pressure control valve
24: dielectric substrate
25: through-hole
26: electrode layer
26A: electrode layer disposed in electrostatic chuck portion
26B: electrode layer disposed in holding portion
27: power supply terminal
28: insulator
29: flow path
30: recess
32, 132: insulator
120: internal space of conduit
125: conduit
150: sintered body
150a: surface
200: temporary mounting table
W: plate-shaped sample
α: area
G1: first grindstone
G2: second grindstone

The invention claimed is:

1. An electrostatic chuck device comprising:
a mounting table provided with a mounting surface on which a plate-shaped sample is mounted;
an annular focus ring; and
a cooling element for cooling the focus ring,
wherein the mounting table has a holding portion provided to surround the mounting surface, the holding portion is formed integrally with the mounting table, and
the holding portion includes:
an annular groove surrounding the mounting surface, and
a through-hole that is open on a bottom surface of the groove,
wherein
a tubular insulator has been inserted into the through-hole,
the holding portion has upper surfaces, which are located on both sides of the groove in a width direction in the holding portion, as two holding surfaces that are in contact with the focus ring and hold the focus ring,
wherein the two holding surfaces satisfy the following conditions (i) to (iii),
(i) surface roughness of the holding surfaces is 0.05 μm or less;
(ii) a flatness of the holding surfaces is 20 μm or less; and
(iii) the holding surfaces do not have a recess having a depth of 1.0 μm or more and extending in a direction intersecting the holding surfaces.

2. The electrostatic chuck device according to claim 1, wherein the holding portion is provided with
the groove,
the through-hole, and
a conduit extending in a thickness direction of the holding portion,
wherein
the bottom surface of the groove and the conduit overlap each other in a plan, and
a tubular insulator is inserted into the conduit.

3. A method for producing an electrostatic chuck device, which is the device according to claim 1, comprising:
a step of preparing a temporary mounting table having
a sintered body provided with
a mounting surface on which a plate-shaped sample is mounted, and
a through-hole provided at circumference of the mounting surface, and
a tubular insulator which has been inserted into the through-hole;
a first grinding step of grinding a surface of the circumference of the mounting surface of the sintered body, into an annular shape;
a step of forming a groove surrounding the mounting surface by digging down the sintered body; and
a second grinding step of grinding again to grind upper surfaces, which are located on both sides of the groove in a width direction.

4. The method for producing an electrostatic chuck device according to claim 3, wherein a grindstone in which a length of the grindstone in a rotation axis direction is longer than a length of the groove in the width direction is used in the second grinding step.

5. The method for producing an electrostatic chuck device according to claim 3, wherein the through-hole in which the insulator has been inserted is ground by the first grinding step and the step of forming the groove, and
the through-hole in which the insulator has been inserted is not ground in the second grinding step.

6. The method for producing an electrostatic chuck device according to claim 3, wherein the temporary mounting table further has, at the circumference of the mounting surface, a conduit extending in a thickness direction in which a tubular insulator has been inserted, and one end of the conduit is not exposed on the surface of the sintered body, and
grinding which is performed in the first grinding step and the step of forming the groove generates a through-hole that is open on a bottom surface of the groove and is formed from the conduit.

7. The method for producing an electrostatic chuck device according to claim 3, wherein
the step of forming a groove is a step of digging down the surface grinded in the first grinding step to form an annular groove.

8. The electrostatic chuck device according to claim 1, wherein the holding portion and the mounting table are formed of a same sintered body.

9. The electrostatic chuck device according to claim 1, wherein the two holding surfaces are annular when viewed in a plan view, and
one continuous step is provided between the holding portion and the mounting surface.

10. The electrostatic chuck device according to claim 1, wherein the mounting table includes an attraction member and a cooling base, and
the attraction member includes a dielectric substrate and an electrode layer embedded in the dielectric substrate.

11. The electrostatic chuck device according to claim 10, wherein the attraction member includes an electrostatic chuck portion as a hill portion and the holding portion, and
the electrode layer is disposed in an interior of each of the electrostatic chuck portion and the holding portion.

12. The electrostatic chuck device according to claim 10, wherein the dielectric substrate is formed from a compound material of silicon carbide and aluminum oxide.

13. The electrostatic chuck device according to claim 10, wherein the dielectric substrate is made of a sintered body of aluminum nitride, aluminum oxide, silicon nitride, zirconium oxide, yttrium oxide, sialon, boron nitride, or silicon carbide, or a composite sintered body which is formed by using two or more types thereof.

14. The electrostatic chuck device according to claim 10, wherein an average crystal grain size of a material which forms the dielectric substrate is 10 μm or less.

15. The electrostatic chuck device according to claim 10, wherein volume resistivity value of the electrode layer is $1.0 \times 10^6$ Ω·cm or less.

16. The electrostatic chuck device according to claim 10, wherein a material which forms the electrode layer is a composite sintered body of silicon carbide and aluminum oxide, a composite sintered body of tantalum nitride and aluminum oxide, a composite sintered body of tantalum carbide and aluminum oxide, or a composite sintered body of molybdenum carbide and aluminum oxide.

17. The electrostatic chuck device according to claim 1, wherein a surface of the focus ring, which comes into contact with the holding portion, has a surface roughness of 0.05 μm or less, and a flatness of 20 μm or less.

18. The electrostatic chuck device according to claim 1, wherein the cooling element comprises tubular insulator having a gas flow path.

19. An electrostatic chuck device comprising:
a mounting table provided with a mounting surface on which a plate-shaped sample is mounted;
an annular focus ring; and
a cooling element for cooling the focus ring,
wherein the mounting table has a holding portion provided to surround the mounting surface,
one continuous step is provided between the holding portion and the mounting surface, and
the holding portion includes:
an annular groove surrounding the mounting surface, and
a through-hole that is open on a bottom surface of the groove,
wherein
a tubular insulator has been inserted into the through-hole,
the holding portion has upper surfaces, which are located on both sides of the groove in a width direction in the holding portion, as holding surfaces that are in contact with the focus ring and hold the focus ring, the holding surfaces have a periodic waviness along a circumferential direction of the holding portion, wherein the periodic waviness has a periodic concavo-convex structure in which a peak and a valley are alternately repeated, wherein the holding surfaces satisfy the following conditions (i) to (iii), (i) surface roughness of the holding surfaces is 0.05 μm or less;

(ii) a flatness of the holding surfaces is 20 μm or less; and (iii) the holding surfaces do not have a recess having a depth of 1.0 μm or more and extending in a direction intersecting the holding surfaces, wherein the recess is located between the adjacent peaks.

20. The electrostatic chuck device according to claim 19, wherein the cycle of the waviness is 60°.

* * * * *